United States Patent [19]

Fatovic

[11] Patent Number: 4,506,759

[45] Date of Patent: Mar. 26, 1985

[54] LOUDSPEAKER ENCLOSURE ARRANGEMENT FOR VOICE COMMUNICATION TERMINALS

[75] Inventor: Peter Fatovic, Ottawa, Canada

[73] Assignee: Northern Telecom Limited, Montreal, Canada

[21] Appl. No.: 506,047

[22] Filed: Jun. 20, 1983

[51] Int. Cl.[3] .............................................. H05K 5/00

[52] U.S. Cl. .................................... 181/151; 181/199

[58] Field of Search ............... 181/141, 145, 146, 150, 181/151, 149, 153, 164, 199, DIG. 1

[56] References Cited

U.S. PATENT DOCUMENTS

| | | | |
|---|---|---|---|
| 3,324,966 | 6/1967 | Heidrich | 181/153 |
| 3,720,285 | 3/1973 | Russell et al. | 181/151 |
| 3,833,085 | 9/1974 | Thomasen | 181/164 |
| 4,312,258 | 1/1982 | Park | 181/150 X |

FOREIGN PATENT DOCUMENTS

| | | | |
|---|---|---|---|
| 502238 | 11/1954 | Italy | 181/151 |

*Primary Examiner*—Benjamin R. Fuller
*Attorney, Agent, or Firm*—F. P. Turpin

[57] ABSTRACT

The invention provides an enclosure arrangement or a loudspeaker adapted to be mounted in a voice communication terminal. The invention provides primary and secondary enclosures for the loudspeaker. The primary enclosure comprises a piece of resilient open cell foam material having one face provided with a concavity suitable for receiving the spider and the voice coil structure of the loudspeaker. The peripheral edge of the one face of the foam material is secured to the peripheral edge of the spider and the outer surface of the foam material has a flexible layer of substantially air-impermeable material, whereby the loudspeaker is provided with an attached flexible enclosure. The secondary enclosure comprises the housing in which the loudspeaker is mounted. The flexibility of the primary enclosure allows energy to be coupled between itself and the secondary enclosure.

18 Claims, 3 Drawing Figures

LOUDSPEAKER ENCLOSURE ARRANGEMENT FOR VOICE COMMUNICATION TERMINALS

The present invention relates generally to sound translating devices and more particularly to loudspeaker enclosure arrangements for use in voice communication terminals.

A loudspeaker consists of a voice coil or motor unit operating an acoustic conical diaphragm, one side of which acts on an enclosed space known as the loudspeaker enclosure. Since the enclosure provides an acoustical load on the diaphragm, the operating characteristics of a loudspeaker are influenced by the acoustical properties of the enclosure. Through the years, very substantial efforts have been directed towards the design of enclosures for the best possible reproduction of sound, especially for so-called high-fidelity equipment.

In the past few years, it has become increasingly common to provide telecommunication equipment and in particular, telephone equipment, with the capability for hands-free voice communication. Similarly, combined voice/data advanced telecommunication terminals such as Displayphone (trademark of Northern Telecom) also use a loudspeaker to provide hands-free voice communication.

However, a number of problems are associated with this development. In the first place, the loudspeakers are usually mounted on an inside surface of the housing, often in a cramped location, and the entire unit including a variety of electronic circuitry therefore becomes a haphazard enclosure for the loudspeaker. Secondly, since this type of equipment is meant to provide only voice communication as opposed to high-fidelity music and since manufacturers find it desirable to minimize the cost and size of their equipment, the loudspeaker employed therein tends to be an inexpensive miniature unit having an acceptable frequency response only in the voice frequency range.

Contributors to the marginal quality of sound produced by such loudspeaker arrangements reside in the lack of proper enclosure and in the effect of loudspeaker cone resonance which results in the unit generating excessive acoustic output near the lower end of the voice frequency spectrum. Of course, the solution to this problem through the use of a custom designed enclosure is entirely feasible but prohibitively expensive.

There have been attempts in the past directed at the modification of a loudspeaker's output performance without mounting it in a proper enclosure. For example, U.S. Pat. No. 3,833,085 describes a low-frequency loudspeaker wherein the tendency to provide excessive midrange acoustic output was solved by providing the speaker with a circular disk of neoprene rubber mounted inside its conical diaphragm. The disk is attached adhesively at its periphery to the diaphragm at a circle spaced inwardly from the outer periphery of the diaphragm and at its center to the support dome for the loudspeaker.

Another method of modifying loudspeaker output response is described in U.S. Pat. No. 3,324,966 which discloses the combination of a loudspeaker and a pseudo-enclosure comprising a pair of sound absorbing chambers interconnected by a valving arrangement in the form of a narrow channel.

Yet another method of providing an enclosure for a loudspeaker is described in U.S. Pat. No. 3,720,285. The purpose of this device was to replace the absorbent material, such as glass fiber, which is often used in enclosures. The patent provides an enclosure comprised of a rigid foamed plastic material which is moulded around a loudspeaker. On curing, the skin of the plastic seals the enclosure to provide a rigid self-contained enclosure. In addition to the practical manufacturing problems associated with such a device, the resultant enclosure increases the low resonant frequency of the loudspeaker. That is precisely the opposite of what the present invention achieves.

As effective as these prior art devices may be for their intended purpose, they represent inadequate, expensive and complex solutions to the problem at hand. It is therefore an object of this invention to provide an economical and simple solution to the problem of shaping the frequency response of a miniature loudspeaker for use in voice communication terminals.

In accordance with the invention, there is provided an electro-acoustic transducer for use in voice communication terminals adapted to receive voice frequency signals. A small loudspeaker has a voice coil structure and a conical diaphragm supported by a spider having a peripheral edge defining the shape of the loudspeaker. A piece of resilient open cell foam material having a shape complementary similar to that of the loudspeaker has one face provided with a concavity suitable for receiving the spider and the voice coil structure. The edge of the foam material is secured to the peripheral edge of the spider and the outer surface of the foam material is covered with a flexible layer of substantially air-impermeable material thereby providing the loudspeaker with an attached flexible back cavity enclosure.

It is also an object of the invention to provide loudspeakers used in voice communication terminals with an improved enclosure arrangement. This is achieved by providing the loudspeaker with a primary enclosure which comprises an attached flexible enclosure and a secondary enclosure which consists of the terminal housing. The flexible enclosure is effective to smooth out the frequency response and to remove the low frequency peak due to the resonant frequency of the loudspeaker. This is achieved without unduly affecting the normal low frequency response of the loudspeaker.

The invention therefore provides an economical enclosure arrangement for a piece of telecommunication equipment wherein the response peak due to the resonant frequency of the loudspeaker is substantially eliminated and in which the overall frequency response is improved. Since the enclosure is small and flexible, the unit may be fitted in a cramped location of a piece of equipment. In addition, the loudspeaker will operate acceptably even if a portion of the flexible enclosure is deformed slightly against an adjacent component or if the enclosure is shaped to match its mounting space.

An example embodiment of the invention will now be described in conjunction with the drawings in which.

Figure 1:
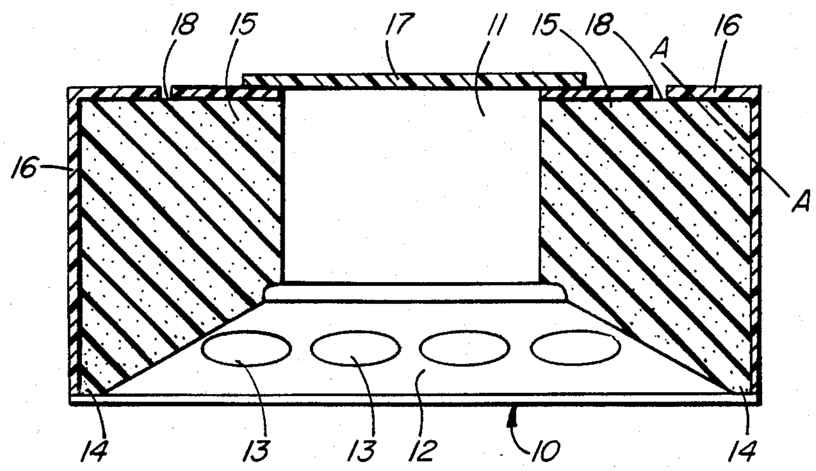
FIG. 1 is a partly sectional view of an electro-acoustic transducer in accordance the invention.

FIG. 1 shows a miniature loudspeaker 10 including a voice coil structure 11, and a spider 12 supporting a conical acoustic diaphragm 13. Such loudspeakers are available as commercial off-the-shelf items and may be circular or rectangular in shape. Common nominal sizes for these loudspeakers are about 2¼ inches in diameter or 2¼ inches by 3 inches. A peripheral edge 14 of the spider 12 defines the perimeter and shape of the loudspeaker 10.

Shown in cross-section is a piece of flexible foam material 15 having an open cell or air-permeable construction. The foam material has a shape complementary similar to that of the loudspeaker; that is, it is either circular or rectangular and is provided with an opening at its approximate geometrical center as well as a conical depression to allow close-fitting engagement with the voice coil structure 11 and the spider 12. For a circular loudspeaker, the foam material is thus somewhat donut-shaped. Of course, it should be realized that the provision of a conical depression or concavity is not usually necessary as the foam will compress easily to adapt to the contour of the spider without unduly affecting the response of the loudspeaker. Foam material suitable to realize the invention is commercially available from various manufacturers. Its basic requirements are flexibility, open cell structure and small pore size to provide maximum sound energy absorption in minimum weight and thickness.

The outer edge of the foam material is adhesively secured to the peripheral edge 14 of the loudspeaker 10. Of course, it is entirely possible to mechanically secure the foam material to the peripheral edge 14 such as by using a continuous clip along the edge 14. In any case, the joint between the foam material 15 and the spider 12 should preferably be air-impermeable.

The outer surface of the foam material 15 is covered by a flexible layer 16 of air-impermeable material which seals the pores of the foam material 15. Various rubber paints and compounds as well as some varnishes are ideally suited to the task. Of course, the sealing material and the foam material must be chemically compatible. For example, silicone rubber compounds have been found to be ideally suited as sealing materials.

The volume enclosed by the flexible layer 16 thus becomes the primary enclosure for loudspeaker 10. The efficiency of the enclosure may be increased by closing the circular opening at the center of the foam material 15. This may be achieved by adhesively securing a circular piece of air-impermeable material 17 over the opening. Of course, the piece 17 should be of a size adequate to seal the opening and may conveniently be made of ABS (Acrylonitrile-Butadine-Styrene) plastic. Alternately, the opening may be sealed simply with paper, cloth or plastic adhesive tape. It should be realized, that a complete enclosure may also be created by using a thicker piece of foam material 15 such that a continuous skin or sealing layer may be obtained. However, the donut-shaped foam material lends itself to advantageous methods of manufacture as well as resulting in a more compact unit.

Figure 2:
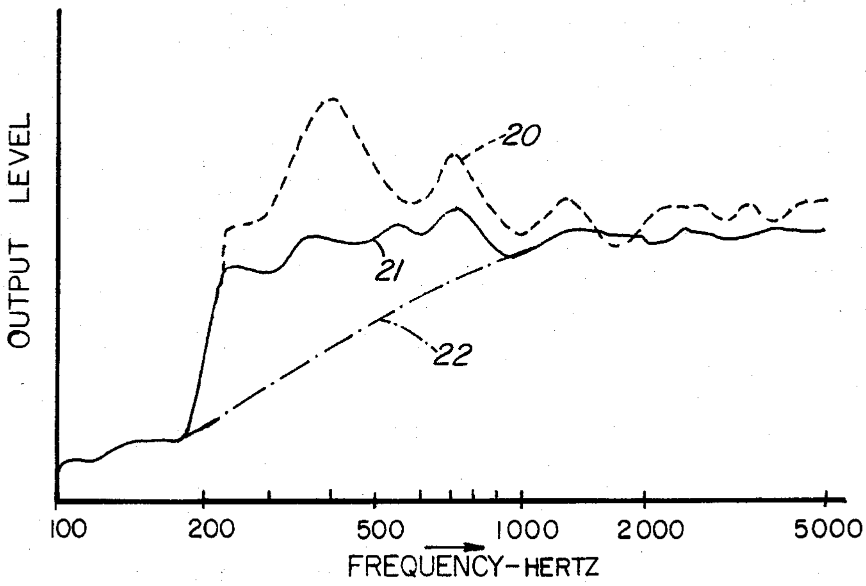
FIG. 2 is a graphical diagram illustrating a typical frequency response for the transducer of FIG. 1.

FIG. 2 is a graphical representation of the improved performance of the transducer of the invention. Waveform 20 represents a nominal frequency response characteristics for a small unmodified loudspeaker mounted in a typical housing of a voice terminal. It is seen that the loudspeaker generates excessive acoustic output from about 200 to 650 hertz as well as a variety of other more minor variations across the voice frequency spectrum. These variations are due partly to the resonant frequency of the loudspeaker and partly to internal housing reflections due to the lack of a proper enclosure for the loudspeaker. Waveform 21 illustrates the smoothing effect provided by the enclosure arrangement of the invention. The resonant frequency effects are cancelled and the effects of housing reflections are substantially minimized without unduly affecting the low frequency response of the speaker.

Waveform 22 illustrates the speaker response that might be expected if the primary enclosure was made of rigid material. The undesirable 400 hertz peak is eliminated, but at the expense of mutilating the low frequency response of the speaker.

The provision of a primary enclosure having a flexible outer layer ensures that there is energy coupling between the primary and secondary enclosures. Of course, the amount of coupling varies in accordance with the degree of flexibility of the sealing layer. The amount of coupling may be further increased by providing the sealing layer with one or more breather holes as indicated at 18. Increasing the size of the hole(s) or the flexibility of the sealing layer increases the low frequency response of the transducer. Of course, the amount of coupling required is dependent on the loudspeaker characteristics and may be determined with a minimal amount of experimentation.

Figure 3:
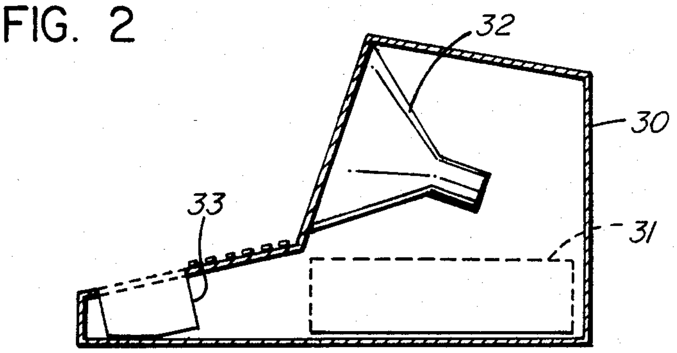
FIG. 3 is a side view, partly in cross-section, of an enclosure arrangement in accordance with the invention.

FIG. 3 illustrates an enclosure arrangement in accordance with the invention. There is shown a typical voice communication terminal comprising a housing 30 which contains a variety of electronic components 31, a CRT 32 and an electro-acoustic transducer 33 having a construction as shown in FIG. 1. The attached flexible enclosure of transducer 33 provides a primary enclosure which is energy coupled to a secondary enclosure formed by the interior volume of housing 30.

It is seen therefore that the invention provides a loudspeaker having an improved frequency response characteristic. Because of its compact size and its flexible self-contained enclosure, the transducer may be fitted in a constrained location of a communication terminal. The flexible enclosure may be deformed slightly without causing the response of the loudspeaker to be greatly affected. Similarly, if it should be necessary due to space restrictions, it is entirely possible to shape the primary enclosure such as by cutting off a small portion. For example, the volume enclosed within the line A—A (FIG. 1) and the outer surface 16 of the enclosure may simply be removed. Of course, the newly exposed surface of foam material 15 would then have to be re-sealed as with silicone rubber.

What is claimed is:

1. An electro-acoustic transducer comprising, a small loudspeaker having a voice coil structure and a conical diaphragm supported by a spider having a peripheral edge defining the shape of the loudspeaker, a piece of resilient open cell foam material having a shape complementary similar to that of the loudspeaker and including an opening at its approximate geometrical center to permit close-fitting engagement with said voice coil structure and means for securing the peripheral edge of one face of said foam material to said peripheral edge of the spider, the outer surface of the foam material being covered with a flexible layer of substantially air-impermeable material, thereby providing the loudspeaker with an attached flexible enclosure.

2. The electro-acoustic transducer defined in claim 1 and further comprising a piece of air-impermeable material of a size at least marginally larger than said opening, the material being adhesively secured to said foam material to effectively seal said opening.

3. The electro-acoustic transducer defined in claim 2 wherein the material is a thin disk of ABS plastic.

4. The electro-acoustic transducer defined in claim 2 wherein the outer flexible layer of the enclosure is provided with at least one energy coupling hole.

5. The electro-acoustic transducer defined in claim 1 wherein said one face of the foam material is also provided with a conical concavity suitable for accommodating said spider.

6. The electro-acoustic transducer defined in claim 1 wherein said foam material is adhesively secured to said peripheral edge.

7. An electro-acoustic transducer comprising, a small loudspeaker having a voice coil structure and a conical diaphragm supported by a spider having a peripheral edge defining the shape of the loudspeaker, a piece of resilient open cell foam material having a shape complementary similar to that of the loudspeaker, one face of the foam material having a concavity suitable for receiving said spider and said voice coil structure, and means for securing the peripheral edge of said one face of the foam material to said peripheral edge, the outer surface of the foam material being covered with a flexible layer of substantially air-impermeable material whereby the loudspeaker is provided with an attached flexible enclosure.

8. The electro-acoustic transducer defined in claim 7 wherein the outer flexible layer of the enclosure is provided with at least one energy coupling hole.

9. The electro-acoustic transducer defined in claim 7 wherein said foam material is adhesively secured to said peripheral edge.

10. An enclosure arrangement for a loudspeaker adapted to be mounted in the housing of a voice communication terminal, comprising, a primary enclosure comprising a small flexible enclosure attached to the loudspeaker, and a secondary enclosure comprising the housing in which the loudspeaker and its attached primary enclosure are mounted, the flexibility of the primary enclosure allowing interaction between itself and the secondary enclosure.

11. An enclosure arrangement for a loudspeaker adapted to be mounted in the housing of a voice communication terminal, the loudspeaker including a voice coil structure and a spider supporting a diaphragm, the arrangement comprising: a primary enclosure comprising a piece of resilient open cell foam material having an opening at its approximate geometrical center to permit close-fitting engagement with said voice coil structure, the peripheral edge of one face of the foam material being secured to the peripheral edge of the spider and the outer surface of the foam material having a flexible layer of substantially air-impermeable material whereby the loudspeaker is provided with an attached flexible enclosure, the secondary enclosure comprising the housing in which the loudspeaker and the attached primary enclosure are mounted, the flexibility of the primary enclosure allowing interaction between itself and the secondary enclosure.

12. The enclosure arrangement defined in claim 11 wherein the opening in the flexible primary enclosure is sealed with a piece of air-impermeable material adhesively secured to the foam material.

13. The enclosure arrangement defined in claim 12 wherein the flexible layer of the primary enclosure is provided with at least one energy coupling hole.

14. The enclosure arrangement defined in claim 11 wherein the foam material of the primary enclosure is adhesively secured to said peripheral edge.

15. The enclosure arrangement defined in claim 11 wherein said one face of the foam material is also provided with a conical concavity suitable for accommodating said spider.

16. An enclosure arrangement for a loudspeaker adapted to be mounted in the housing of a voice communication terminal, the loudspeaker including a voice coil structure and a spider supporting a diaphragm, the arrangement comprising: a primary enclosure comprising a piece of resilient open cell foam material having one face provided with a concavity suitable for receiving the spider and the voice coil structure of the loudspeaker, the peripheral edge of said one face of the foam material being secured to the peripheral edge of the spider and the outer surface of the foam material having a flexible layer of substantially air-impermeable material whereby the loudspeaker is provided with an attached flexible enclosure, the secondary enclosure comprising the housing in which the loudspeaker and the attached primary enclosure are mounted, the flexibility of the primary enclosure allowing interaction between itself and the secondary enclosure.

17. The enclosure arrangement defined in claim 16 wherein the outer flexible layer of the primary enclosure is provided with at least one energy coupling hole.

18. The enclosure arrangement defined in claim 16 wherein the foam material of the primary enclosure is adhesively secured to the peripheral edge of the spider.

* * * * *